United States Patent [19]
Wilsher

[11] Patent Number: 5,287,022
[45] Date of Patent: Feb. 15, 1994

[54] METHOD AND CIRCUIT FOR CONTROLLING VOLTAGE REFLECTIONS ON TRANSMISSION LINES

[75] Inventor: Kenneth R. Wilsher, Palo Alto, Calif.

[73] Assignee: Schlumberger Technologies, San Jose, Calif.

[21] Appl. No.: 37,507

[22] Filed: Mar. 24, 1993

Related U.S. Application Data

[63] Continuation of Ser. No. 764,026, Sep. 23, 1991, abandoned.

[51] Int. Cl.$^5$ ............................ H03K 5/08; H03F 1/26
[52] U.S. Cl. .................................... 307/542; 307/475; 307/520; 307/540; 307/551; 307/490; 333/22 R
[58] Field of Search ............... 307/475, 540, 542, 520, 307/551, 552, 570, 490, 465; 333/22 R, 37

[56] References Cited

U.S. PATENT DOCUMENTS

| | | | |
|---|---|---|---|
| 2,867,735 | 1/1959 | Kaufman | 307/565 |
| 2,927,223 | 3/1960 | Merowitz | 307/551 |
| 3,214,680 | 10/1965 | Kroll | 307/552 |
| 3,287,567 | 11/1966 | Gaoh | 307/565 |
| 3,568,073 | 3/1971 | McGuffin | 307/565 |
| 3,805,090 | 4/1974 | Kaiser | 307/551 |
| 4,153,848 | 5/1979 | Miyazaki | 307/268 |
| 4,345,171 | 8/1982 | Harris, Jr. | 307/560 |
| 4,543,495 | 9/1985 | Owen | 307/542 |
| 4,661,979 | 4/1987 | Jakab | 307/565 |
| 4,952,795 | 8/1990 | Gauthier et al. | 307/565 |
| 5,029,284 | 7/1992 | Feldbaumer et al. | 307/475 |

FOREIGN PATENT DOCUMENTS 46-13448 9/1971 Japan .................................. 307/565

OTHER PUBLICATIONS

Barish et al; IBM-Tech. Disc. Bult. "Active Terminator"; Dec. 1974; p. 1960.

Primary Examiner—William L. Sikes
Assistant Examiner—Terry D. Cunningham
Attorney, Agent, or Firm—Skjerven, Morrill, MacPherson, Franklin & Friel

[57] ABSTRACT

The invention is a termination circuit which may be used to terminate a tester end of a transmission line between the tester and a digital device under test (DUT). The termination circuit is a clamp circuit which acts as a non-linear resistor of infinite resistance for termination voltages between zero volts (or low logic level voltage) and the power supply voltage $V_{cc}$ (or high logic level voltage) of the DUT, and which provides a substantially constant slope resistance set to equal the characteristic impedance ($Z_O$) of the transmission line for voltages outside this range. Given that the output impedance of the DUT is less than the characteristic impedance $Z_O$ of a transmission line, and given the characteristics of the clamp circuit, all reflections on the transmission line as a result of unmatched impedances are totally eliminated by the clamp in twice the delay time of the transmission line. After the reflections are eliminated, the clamp acts as an open circuit. This clamp circuit may be used in virtually any application where reflections are a concern.

13 Claims, 4 Drawing Sheets

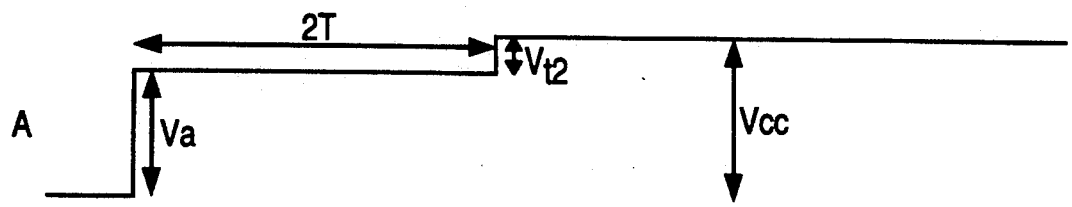
Fig. 4A
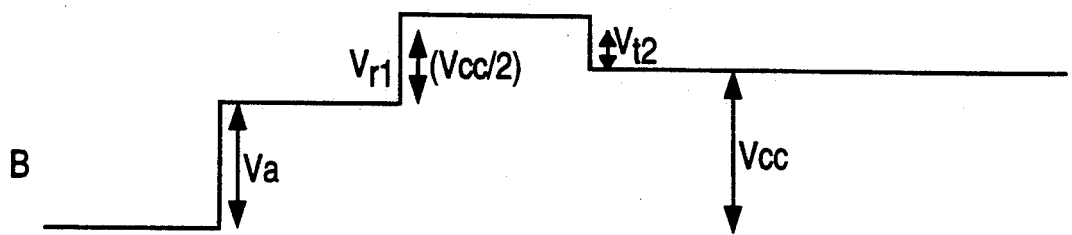
Fig. 4B
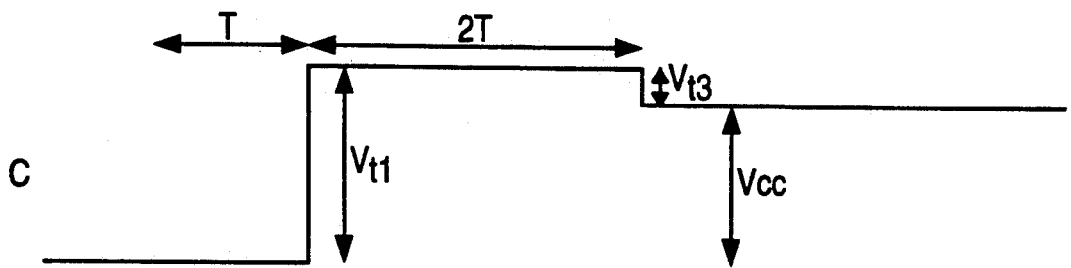
Fig. 4C

METHOD AND CIRCUIT FOR CONTROLLING VOLTAGE REFLECTIONS ON TRANSMISSION LINES

This application is a continuation of application Ser. No. 07/764,026, filed Sep. 23, 1991 now abandoned.

FIELD OF THE INVENTION

This invention relates to testing integrated circuits and, in particular, to the dynamic testing of integrated circuits using a remote automatic tester.

BACKGROUND OF THE INVENTION

The dynamic operating characteristics of an integrated circuit (IC), such as switching speed characteristics and min./max. edge-to-edge timing of waveforms, are typically determined by an automatic tester. For example, the tester may be programmed to transmit a series of test waveforms to various input/output (I/O) ports of a device under test (DUT), such as an IC, and measure the resulting output levels and response times of the IC. Such testing may determine whether the IC works properly and also determine the required timing of any input signals for the proper operation of the DUT.

Since such response times of the DUT are generally on the order of a few nanoseconds (ns), the transmission lines connecting the DUT to the tester should have a minimum of delay, as will be further explained later, even though this delay is taken into account by the tester when calculating the response times. A transmission line approximately 0.5 meters in length connecting a tester to a DUT may have a delay on the order of 2.5 ns.

To avoid or limit reflections of a transmitted step voltage propagating back through the transmission line due to unmatched impedances of the DUT or tester with the transmission line, the input impedance of the DUT and the tester must ideally match the characteristic impedance ($Z_O$) of the transmission line so that all the energy provided to the input of the DUT or tester by the transmission line is completely absorbed by the DUT or tester.

In a normal operating environment for an IC (e.g., on a circuit board), the IC ports are generally connected to other devices by transmission lines of only a few inches in length, so although reflections may exist, the reflections die out within a short period of time due to the small time delay between the ends of these short transmission lines. However, in a test setup where a DUT is connected to a tester, the transmission lines are much longer and thus the relatively long delay before any reflections die out may cause a reflected step voltage to be misinterpreted as an intentionally generated test or response signal, resulting in inaccurate test results.

Further, since many pins of an IC may be bi-directional, switching from an input mode to an output mode in only a few nanoseconds, even reflections lasting only a few round-trips of the transmission line may cause the IC, having an I/O pin which has been switched from an output mode to an input mode, to undesirably be triggered by a reflected step voltage.

This problem with reflections is especially acute as the operating frequencies of the DUT increases and the rise times of the tester and DUT waveforms fall, since reflected signals being delayed several nanoseconds due to the transmission line propagation delay will be more likely to be misinterpreted as an intentionally generated test or response signal.

Similar problems with reflections may also exist where a high speed electrical device is connected to any device, not just a tester, by a relatively long transmission line.

FIG. 1 generally illustrates a prior art connection between a DUT 10 and an automatic tester 14 via a transmission line 16. FIG. 1 shows only a single transmission line connected to a single I/O pin 18 of DUT 10 for purposes of illustrating the present problems with reflections during testing of DUT 10. In an actual test setup there would typically be one transmission line for each I/O pin of DUT 10.

It will be assumed for purposes of explaining how a reflection occurs that the output signal of DUT 10 is provided by a CMOS output buffer 20, represented by a pull-up resistor having a value $R_{hi}$ (actually a PMOS device) and a pull-down resistor having a resistance of $R_{lo}$ (actually an NMOS device). In response to a control signal by DUT 10 to CMOS buffer 20, pin 18 is switched to either power supply voltage $V_{cc}$ through resistor value $R_{hi}$ or to ground via resistor value $R_{lo}$. Such switching may occur at rates up to 20 MHz or faster.

A typical transmission line 16 connecting DUT 10 to tester 14 will have a characteristic impedance ($Z_O$) on the order of 50-100 ohms, where characteristic impedance $Z_O$ is given by the equation, $$Z_O = \sqrt{L/C} \qquad (eq.\ 1)$$

where
   L equals the inductance of the transmission line per unit length, and
   C equals the capacitance of the transmission line per unit length.

Tester 14 will be assumed for this case to incorporate a comparator 24 having an input terminal coupled to transmission line 16 for comparing the input signal from transmission line 16 to a threshold voltage $V_{th}$ on line 26.

The input impedance of tester 14, determined by shunt resistor 27 having a value $R_t$, is typically set to match the $Z_O$ of the transmission line 16 so that any input signals will be completely absorbed and no reflected signals created. Since the same transmission lines are typically always used with the tester, the manufacturer of the tester may easily fix this input impedance value $R_1$ to match the $Z_O$ of the transmission line.

Tester 14 may also include a transmitter 28 selectively coupled to transmission line 16 for supplying a test waveform to DUT 10, where pin 18 of DUT 10 would first be configured to be in an input mode instead of in an output mode as shown in FIG. 1.

The prior art also sometimes incorporates diodes, such as diodes D1 and D2 in FIG. 1, at the tester termination of transmission line 16 to prevent any termination voltages from rising significantly above a threshold voltage $V_x$ and significantly below ground voltage. However, one problem with using diodes in the configuration of FIG. 1 is that $V_x$ and $V_y$ must be carefully adjusted for each DUT 10, since each DUT 10 has different characteristics which would affect the value of $V_x$ and $V_y$.

Although the input and output impedance of tester 14 may be preset to match the $Z_O$ of transmission line 16, DUT 10 will most likely have an input impedance well above the $Z_O$ of transmission line 16 and have an output impedance well below the $Z_O$ of transmission line 16. For example, the input impedance of MOSFET input buffers are extremely high due to the insulated gate of the MOSFET, and fast MOSFET output buffers may have output impedances as low as 5 ohms. Thus, any test signal or reflected signal being provided to a pin of DUT 10 will most likely cause another reflected signal to be sent back along transmission line 16 away from DUT 10.

If neither the total terminal impedance $R_t$ of tester 14 or the impedance of pin 18 of DUT 10 is equal to the $Z_O$ of transmission line 16, then the series of reflections back and forth across transmission line 16 will repeat until these reflections die out in an exponential manner due to the attenuation in the system. The time between the steps of these reflected waveforms returning to a same terminal is twice the delay time of transmission line 16.

For simplicity, the below discussion, providing a mathematical basis for understanding reflections on a transmission line, will ignore the effect of diodes D1 and D2 in FIG. 1 and set the $R_{hi}$ value of the pull-up resistor of CMOS buffer 20 in FIG. 1 to $R_g$.

In FIG. 1, if CMOS output buffer 20 puts a positive step voltage transition on transmission line 16 by connecting transmission line 16 to $V_{cc}$ through resistance $R_g$, the amplitude of the step at node A shown in FIG. 1 will be $$V_a = V_{cc} \cdot Z_O / (Z_O + R_g). \qquad (eq.\ 2)$$

The step of voltage $V_a$ propagates along transmission line 16 and reaches tester 14 where it produces a voltage $V_t$ across the terminating resistor $R_t$, where $$V_t = 2 \cdot V_a \cdot R_t / (Z_O + R_t) \qquad (eq.\ 3)$$

Since $R_t$ is typically not exactly equal to $Z_O$, there will be a reflected step which propagates back to BUT 10 with an amplitude of $$V_r = V_t - V_a, \qquad (eq.\ 4)$$

where $V_r$ is a reflected step equal to the voltage that the termination is driven to $(V_t)$ minus the voltage at the other end of the transmission line $(V_a)$ which gave rise to the termination voltage.

In the condition where $Z_O = R_t$, $V_r$ is zero and the activity on the line stops with a constant voltage throughout the line until the output of DUT 10 is again switched. If $Z_O$ does not equal $R_t$ then when the reflected step $V_r$ reaches pin 18 of DUT 10 it may be completely absorbed (if $R_g = Z_O$) or a new reflection will start traveling away from DUT 10.

If neither the source or the load impedances are equal to $Z_O$, then the series of reflections is infinite, dying out in an exponential manner, with the time between steps of these waveforms being twice the delay time of the transmission line.

To make test results most valuable to a user of the DUT, realistic loading conditions should be used when testing the DUT. For example, a single output buffer in DUT 10 may drive a number of output pins of DUT, where all of these output pins are intended to be coupled to a high impedance input of another IC, such as to an input of a CMOS device. A CMOS output device in a DUT could possibly drive a single terminated transmission line, such as transmission line 16, directly since the load provided by the single transmission line and the tester (e.g., $R_t$) will not overload the CMOS output device. However, a CMOS output device in a DUT driving a number of outputs, and hence a number of transmission lines, generally could not be so heavily loaded and still operate as it would in a realistic environment. To ameliorate this problem, the prior art, to reduce the loading on a DUT output buffer, inserts a series resistor between the appropriate DUT pin and the transmission line leading to the tester. The tester end of the transmission line is then terminated by a shunt resistor equal to the characteristic impedance $(Z_O)$ of the transmission line, where one end of the termination resistor is coupled to a voltage about midway between ground and the power supply voltage $V_{cc}$ to compensate for the voltage drop across the series resistor. Thus, a number of these high impedance transmission lines may be driven by the CMOS output device without unduly loading the CMOS output device.

When the output device in the DUT now drives one or more tester inputs, the final voltage produced at the tester inputs is a good, but attenuated, representation of the DUT output voltage. In the case of a 50-ohm transmission line, the resistor placed in series with the DUT output may be 150 ohms, and the termination resistor will be 50 ohms to match the transmission line $Z_O$. This would provide an effective 4:1 attenuation of the DUT output voltage across the termination resistor.

One disadvantage to this approach is that, when the bi-directional pin of the DUT connected to the series resistor is now controlled to be an input port, and the tester now drives this DUT pin through the series resistor, the extra impedance (150 ohms in the example given) will undesirably greatly increase the rise time of the tester drive waveform at the DUT pin due to the RC low pass filter formed by the series resistor and the input capacitance of the DUT.

Further, during a DC test of the DUT where a DC current is used to load the DUT outputs to see the effect on the output voltages and to determine the output impedance of the DUT, the range of load currents that can be applied during this test is restricted because the voltage drop across the series resistor has to be accommodated by the tester current source, and the measurement of the DUT output voltage by the tester must precisely account for this resistor voltage drop. Thus, this approach for preventing an unduly heavy load on a DUT output has numerous drawbacks which adds to the complexity of testing a device.

Still further, since each DUT type generally has output devices having a different output impedance than that found in other DUT types, the series resistor has to be adjusted to take into account these various output impedances so that the tester can take account of the precise voltage drops which occur between the tester and the DUT. This means that the interface board between the tester and the DUT must be changed for testing different IC's, even in the same basic family.

What is needed in this field is a means to terminate a transmission line coupling a DUT and a tester, wherein the same transmission line and termination means can be used for testing different IC's and wherein the termination would not unduly load any DUT output. This termination should also limit reflections from interfering with the accurate test results obtained by the tester. This termination should also not substantially increase the impedance between the tester and the DUT in a manner which would increase the rise time of any drive waveform.

SUMMARY OF THE INVENTION

The invention is a termination circuit which may be used, in one application, to terminate a tester end of a transmission line between the tester and a digital device under test (DUT). The termination circuit is a clamp circuit which acts as a non-linear resistor of infinite resistance for termination voltages between zero volts (or low logic level voltage) and the power supply voltage $V_{cc}$ (or high logic level voltage) of the DUT, and which provides a substantially constant slope resistance set to equal the characteristic impedance ($Z_O$) of the transmission line for voltages outside this range.

Given that the output impedance of the DUT will typically be less than the characteristic impedance $Z_O$ of a transmission line, and given the characteristics of the clamp circuit, a positive step generated by the DUT and introduced on the transmission line will be partially reflected by the tester termination as a first reflected positive step, where this positive step will be necessarily identical for all output impedances of the DUT less than $Z_O$, and is equal to $V_{cc}/2$.

This first reflected step will return to the DUT and necessarily produce a negative reflected step heading toward the tester.

This second reflection will be totally absorbed by the clamp due to the characteristics of the clamp as previously described. Thus, at this point, the transmission line voltage is equal to the high logic output voltage of the DUT along its complete length and there are no more reflections. Thus, after at most two reflections, all reflections are eliminated.

A negative step generated by the DUT will be dealt with in the same way.

By using this inventive clamp, there is no added loading on the tester end of the transmission line when the voltage on the line is stable and, therefore, there are no problems with overloading a DUT output. Thus, there is no need to incorporate a series resistor in the line to lower the load connected to an output of the DUT, as done by the prior art.

Further, reflections are necessarily eliminated within a very short period of time (two trips through the transmission line), thus precluding reflections from affecting the test results obtained during a dynamic test when the DUT output edges are separated by more than twice the delay time of the transmission line (e.g., edges separated by more than 5 ns).

This clamp circuit may be used in virtually any application where reflections are a concern.

BRIEF DESCRIPTION OF THE DRAWINGS

FIGS. 4a-4c illustrate voltage levels with respect to time at three nodes along a transmission line in response to a positive step voltage generated by a device under test.

DETAILED DESCRIPTION OF PREFERRED EMBODIMENT

Figure 1:
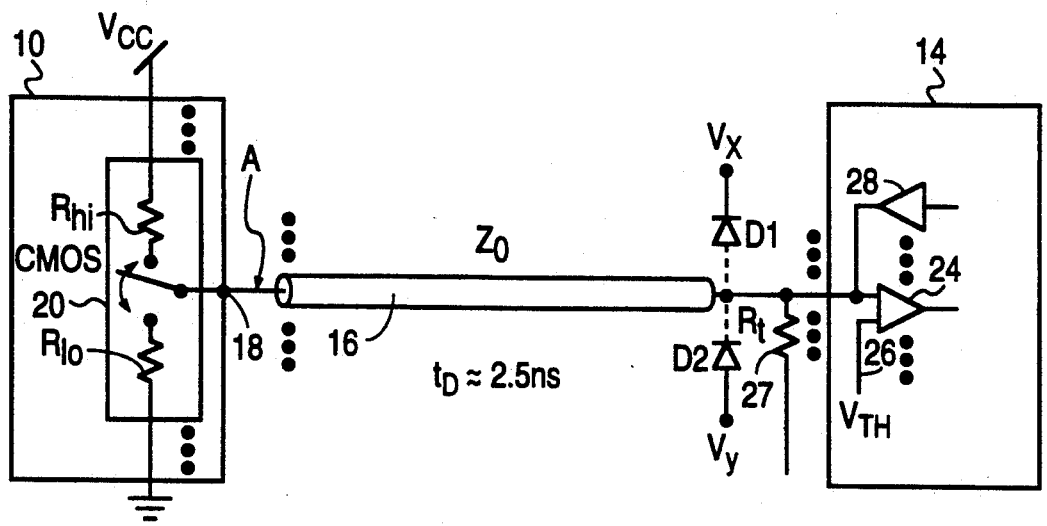
FIG. 1 illustrates a prior art transmission line termination used during testing of an integrated circuit by an automatic tester.
Figure 2:
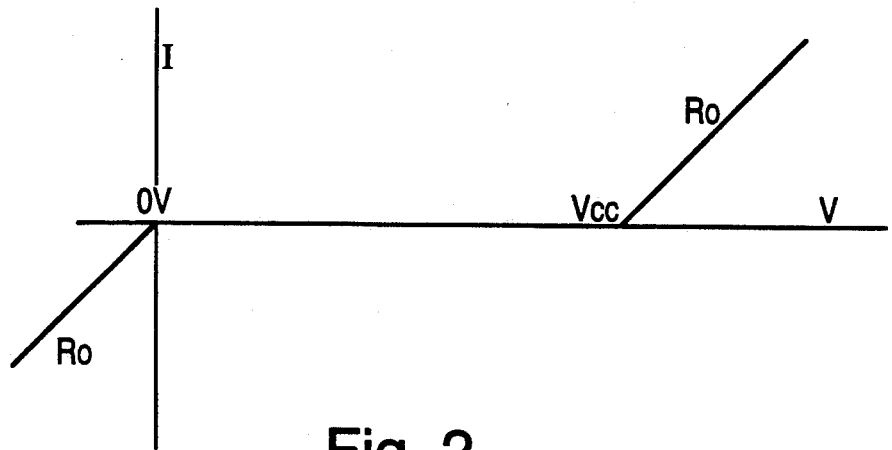
FIG. 2 illustrates the electrical characteristics of a clamp circuit in accordance with this invention.

FIG. 2 illustrates the voltage/current (V/I) characteristics of a termination clamp in accordance with the present invention. A clamp providing such V/I characteristics may be formed in a number of ways. In one application, this clamp is coupled to the tester end of a transmission line with the other end of the transmission line coupled to a port of a device under test (DUT). The DUT may be an integrated circuit (IC) or other electrical circuit. Various embodiments of circuits which provide the V/I characteristics shown in FIG. 2 will be discussed later with respect to FIGS. 5-7.

As will be shown, the advantages and characteristics of the clamp circuit include:

(a) Transmission line reflections between a DUT and a tester are completely eliminated in twice the delay time of the transmission line. Thus, the DUT output edges separated by more than twice the delay time will not interfere with each other.

(b) for a DUT driving a tester input with a zero volt to $V_{cc}$ logic step, the clamp circuit provides a constant load to the tester termination equal to the characteristic impedance ($Z_O$) of the transmission line for only those voltages above $V_{cc}$ or below zero volts. This eliminates all reflections within twice the delay time of the transmission line; then the load becomes infinite.

(c) The clamp conduction voltages are easily set to accommodate all device types having an output impedance less than $Z_O$.

(d) The clamp circuit works for DUT output resistances from $Z_O$ to zero ohms. For DUT output resistances greater than $Z_O$, the clamp remains an infinite impedance, since voltages incident on the termination remain between 0 volts and $V_{cc}$. In such cases, although the clamp is transparent, reflections present no problems. Thus, no adjustments are needed for the entire range of DUT output impedances.

(e) The clamp circuit does not interfere with DC loading tests of the DUT output.

The operation of such a clamp circuit in eliminating reflections within two round-trip delay times of the transmission line is mathematically proven later.

Figure 3:
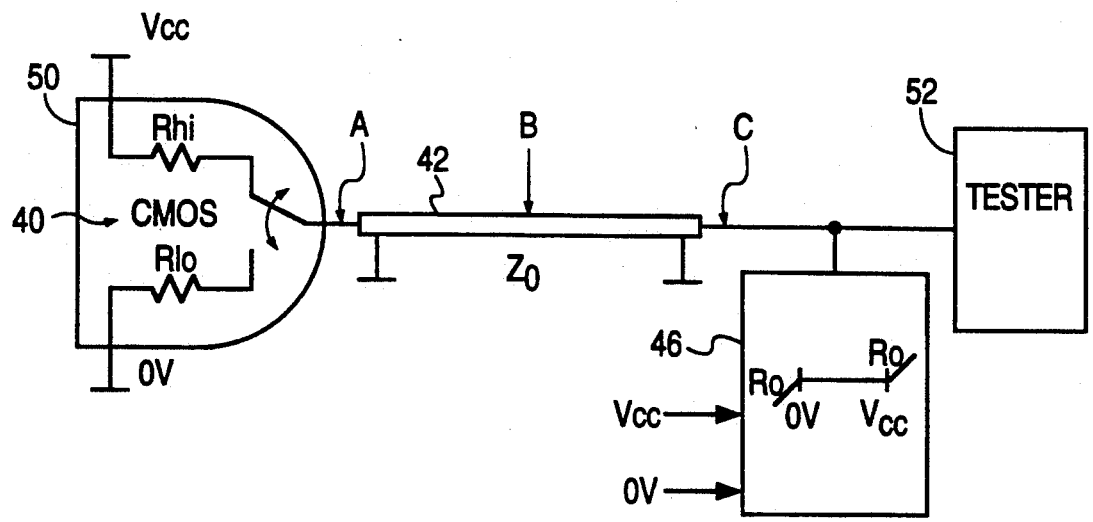
FIG. 3 illustrates the clamp circuit of this invention when used in a test configuration for testing an integrated circuit or other electronic device.

FIG. 3 shows a representation of a CMOS output device 40 having an output resistance ($R_{hi}$ and $R_{lo}$) less than the $Z_O$ of transmission line 42 to which the CMOS output is connected. The other end of transmission line 42 is terminated by a clamp circuit 46 in accordance with the invention. The V/I characteristics of clamp 46 are shown in FIG. 2.

Clamp 46 acts as a non-linear resistor of infinite resistance for voltages at Node C between zero volts and $V_{cc}$ and presents a slope resistance at Node C of $R_O$ equal to the characteristic impedance $Z_O$ of the transmission line 42 for voltages outside this range.

In the embodiment of FIG. 3, CMOS device 40 is an output buffer for a DUT 50, and clamp circuit 46 is coupled to an input of an automatic tester 52.

The action of clamp 46 for a positive transition of DUT 50 is as follows:

CMOS device 40 switches from a low to high output voltage and puts a positive voltage step of amplitude $V_a$ (see FIG. 4a) on Node A of FIG. 3, where $$V_a = V_{cc} \cdot Z_O/(Z_O + R_{hi}). \qquad (eq.\ 5)$$

Typically, $Z_O$ is about 50 ohms for a conventional transmission line, and $R_{hi}$ is between 5 and 20 ohms for medium to high speed DUT's. Therefore, $V_a$ will be between $V_{cc}$ and $V_{cc}/2$.

This step propagates along line 42 and reaches the clamp end where it produces a termination voltage step $V_{t1}$, (see FIG. 4c) where $t_{t1}$ is calculated using eq. 3 in conjunction with the clamp characteristics of FIG. 2 as follows:

$$V_{t1} = V_{cc} + (2 \cdot V_a - V_{cc}) R_O/(Z_O + R_O). \qquad (eq.\ 6)$$

Since $R_O = Z_O$, $$V_{t1} = V_{cc} + (2 \cdot V_a - V_{cc})/2. \qquad (eq.\ 7)$$

Equations 6 and 7 are best understood by realizing that, since $V_a > V_{cc}/2$, $2V_a$ will be greater than $V_{cc}$. Since the clamp only provides a resistance $R_O$ to those voltages exceeding $V_{cc}$, only the portion of the voltage $2V_a$ above $V_{cc}$ will be affected by the clamp load of $R_O$, and positive voltages below $V_{cc}$ will see an infinite impedance.

Substituting for $V_a$ with the term shown in eq. 5 gives $$V_{t1} = V_{cc}/2 + V_{cc} \cdot Z_O/(Z_O + R_{hi}). \qquad (eq.\ 8)$$

From eq. 4, a resulting reflected step $V_{r1}$ (see FIG. 4b) on line 42 returning to DUT 50 is then produced having a value equal to the potential difference across the transmission line of $$V_{r1} = V_{t1} - V_a. \qquad (eq.\ 9)$$

Substituting for $V_{t1}$ and $V_a$, previously calculated, $$V_{r1} 32 V_{cc}/2. \qquad (eq.\ 10)$$

Thus, $V_{r1}$, heading back toward DUT 50, will always be a positive step.

This step $V_{r1}$ returns to DUT 50 where it generates a termination voltage step $V_{t2}$, (see FIG. 4a) calculated using eq. 4 as $$V_{t2} = 2 \cdot V_{r1} \cdot R_{hi}/(Z_O + R_{hi}). \qquad (eq.\ 11)$$

Substituting for $V_{r1}$ from eq. 10 gives $$V_{t2} = V_{cc} \cdot R_{hi}/(Z_O + R_{hi}), \qquad (eq.\ 12)$$

which is a positive step also.

The resulting DUT output voltage is then $$V_a + V_{t2} = V_{cc} \cdot Z_O/(Z_O + R_{hi}) + V_{cc} \cdot R_{hi}/(Z_O + R_{hi}). \qquad (eq.\ 13)$$

Reducing eq. 13 gives $$V_a + V_{t2} = V_{cc}. \qquad (eq.\ 14)$$

There is now a reflection $V_{r2}$ from DUT 50 heading back to tester 52 having a value $$V_{r2} = (V_a + V_{t2}) - V_{t1}, \qquad (eq.\ 15)$$

where $V_{t1}$ is the step voltage from eq. 8 existing at the clamp end.

By substituting eq. 14, $$V_{r2} = V_{cc} - V_{t1}. \qquad (eq.\ 16)$$

This reflected voltage $V_{r2}$ from DUT 50 Will always be a negative step since, as seen by eq. 8, $V_{t1}$ is greater than $V_{cc}$ given that $R_{hi}$ is less than $Z_O$. This reflected step $V_{r2}$ is then terminated at the clamp end as a step voltage $V_{t3}$ (see FIG. 4c) having a value $$V_{t3} = 2 \cdot V_{r2} \cdot R_O/(R_O + Z_O), \qquad (eq.\ 17)$$

given that clamp 46 provides a slope resistance $R_O$ to all voltage above $V_{cc}$, as shown in FIG. 2.

Combining equations 16 and 17, and considering that $R_O = Z_O$, gives $$V_{t3} = 2 \cdot (V_{cc} - V_{t1})/2. \qquad (eq.\ 18)$$

Thus, $$V_{t3} = V_{cc} - V_{t1}. \qquad (eq.\ 19)$$

The total voltage at the clamp end is now $$V_{clamp} = V_{t1} - V_{t3}. \qquad (eq.\ 20)$$

Substituting for $V_{t3}$ from eq. 19 gives $$V_{clamp} = V_{t1} - (V_{cc} - V_{t1}). \qquad (eq.\ 21)$$

or $$V_{clamp} = V_{cc}. \qquad (eq.\ 22)$$

There are no reflections after this, since the transmission line voltage is equal to $V_{cc}$ along its entire length, as seen by a comparison of the voltages at both ends of the transmission line given in equations 14 and 22. Thus, reflections on the transmission line (see FIGS. 4a and 4c) have been totally eliminated in two delay times of the transmission line, and the clamp now presents no load to the transmission line, resulting in the advantages previously described.

A negative step generated by DUT 50 will be dealt with in a similar manner with the elimination of reflections in two delay times of the transmission line.

Implementation of Clamp With V/I Characteristics of FIG. 2

The ideal clamp characteristics shown in FIG. 2 can be approximated by any of the circuit embodiments shown in FIGS. 5a, 5b, 6a, 6b, and 7.

Figure 6A:
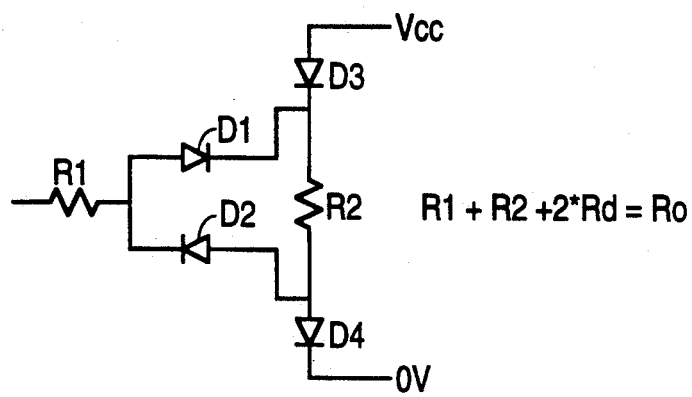
Figure 6B:
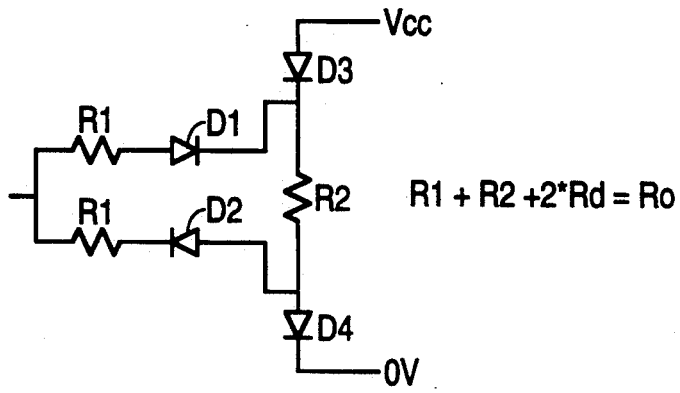
Figure 7:
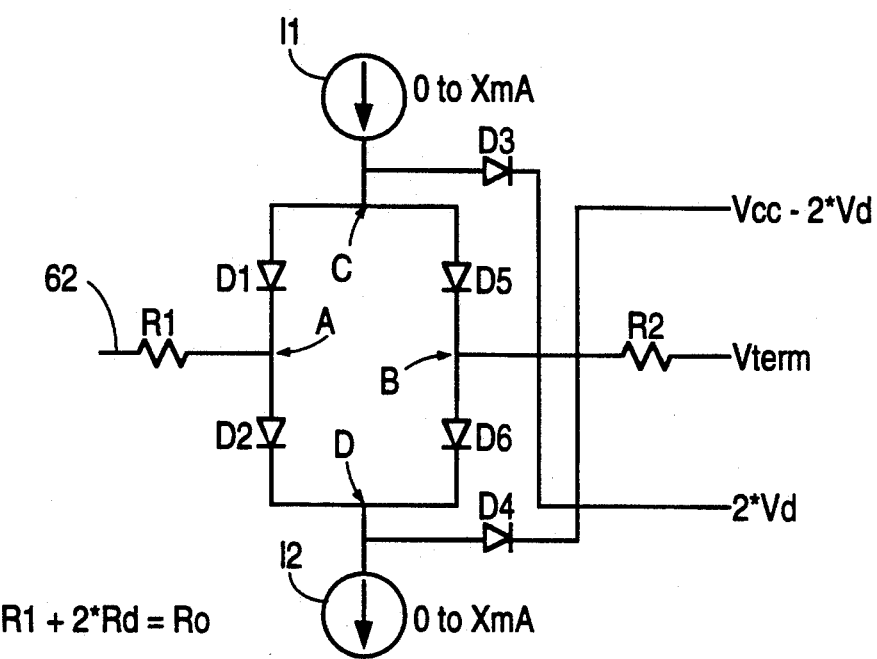

These clamps, if used in the configuration of FIG. 3, would have an input terminal connected to the tester 52 input terminal and its threshold voltage terminals connected to any power source which supplies the voltages identified in FIGS. 5-7. In the clamps shown in FIGS. 5-7, $V_{cc}$ is the power supply voltage of the DUT (i.e., the logic high voltage), and $V_d$ is a voltage drop across a diode (e.g., typically 0.7 volts).

Figure 5A:
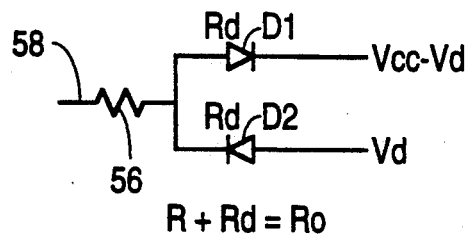
FIGS. 5a, 5b, 6a, 6b, and 7 provide various circuit embodiments to approximate the clamp characteristics of FIG. 2.
Figure 5B:
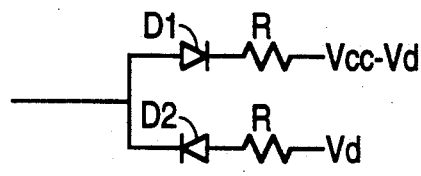

The simplest clamp circuit is shown in FIGS. 5a and 5b. The sum of the series resistance R of resistor 56 and the internal resistance $R_d$ of diode D1 or D2 is set to match the characteristic impedance $Z_O$ of a transmission line connected to input terminal 58 of the clamp circuit. A change in temperature will change the effective clamp voltage by about 2 mV/deg C. In operation, any voltage supplied to input terminal 58 between zero volts and $V_{cc}$ will cause diodes D1 and D2 to remain open circuits, and the clamp will provide an ideally infinite resistance to a voltage applied to input terminal 58.

A voltage applied to terminal 58 above $V_{cc}$ will forward bias diode D1, and this voltage above $V_{cc}$ will pass through a total resistance $R_O = R + R_d$, wherein $R_O$ is set to match the characteristic impedance $Z_O$ of the transmission line connected to input 58.

A voltage applied to terminal 58 below 0 volts will forward bias diode D2, and the clamp will provide a resistance equal to $Z_O$ to any voltage below zero volts.

Thus, the V/I characteristics of the graph of FIG. 2 are approximately produced by the clamp of FIG. 5a.

The clamp of FIG. 5b operates in essentially the same manner as the clamp of FIG. 5a except a resistor is associated with each diode D1 and D2. In the clamp of FIG. 5b, the internal resistances of the two diodes plus the series resistor value R is equal to $Z_O$.

The clamp circuit of FIG. 6a operates in essentially the same manner as the clamp of FIG. 5a. In the clamp of FIG. 6a, the proper threshold voltages applied to the cathode of D1 and the anode of diode D2 are generated by the series connection of diode D3, resistor R2, and diode D4 connected between $V_{cc}$ and ground. Since a forward biased diode D1 or D2 will also cause current to be conducted through resistor R2 and diode D4, or resistor R2 and diode D3, the selection of the values R1 and R2 must be such that $R1 + R_d + R2 + R_d = Z_O$. This will give the clamp of FIG. 6a the V/I characteristics shown in FIG. 2.

If the temperatures of the diodes are kept equal, then the effective clamp conduction voltage is stable with changing temperature.

The clamp circuit of FIG. 6b is a variant of the clamp shown in FIG. 6a and incorporates a series resistor having a value R1 associated with each of diodes D1 and D2. The operation of the circuit of FIG. 6b is similar to that of FIG. 6a.

FIG. 7 illustrates a preferred embodiment of the termination clamp which provides a good approximation of the V/I characteristics of FIG. 2 when set to a dynamic test mode and provides a very low current load to the termination when set to the DC test mode even if the clamp input voltage exceeds $V_{cc}$ or is a negative voltage.

The clamp of FIG. 7, in one application, has its input 62 connected to a termination of a tester as shown in FIG. 3. Voltage $V_{term}$ is set to between zero volts and $V_{cc}$, preferably to $V_{cc}/2$. During dynamic testing of the DUT, current sources I1 and I2 are turned off (i.e., 0 ma). Given that a high DUT output voltage is $V_{cc}$ and a low DUT output voltage is zero volts, the voltage $(V_{cc} - 2*V_d)$ is applied to the cathode of diode D4, and the voltage $2*V_d$ is applied to the anode of diode D3. This causes diode D1 to turn on when the voltage at Node A is lower than zero volts and causes diode D2 to turn on when the voltage at Node A is greater than $V_{cc}$. When either diodes D1 and D3 or diodes D2 and D4 are forward biased, the load on clamp input terminal 62 will be $R1 + 2*R_d = R_O$, where $R_O$ is set to the characteristic impedance $Z_O$ of the transmission line. Thus, in this dynamic mode setting the characteristics of the clamp of FIG. 7 will be that shown in FIG. 2.

When it is desired to conduct DC loading tests on the DUT to determine the DC characteristics of the DUT, it is desirable that the termination clamp present virtually no load for an input voltage of $V_{cc}$ or zero volts, since the clamp is no longer needed to eliminate reflections, and any load by the clamp may cause inaccurate test results.

During DC testing, current sources I1 and I2 are turned on to source and sink, respectively, specified DC currents. Such currents may be up to 50 ma for a transmission line $Z_O$ of 50 ohms and a $V_{cc}$ of 5 volts.

When the DUT output goes to its low voltage state it has to sink I1. When the DUT output goes to its high voltage state it has to source I2. For output voltages between 0 and Vcc the diodes D3 and D4 are reverse biased so do not effect the accuracy of the sink and source currents I1 and I2.

The circuit of FIG. 7 can also be configured to act as a line termination (Ro=Zo) to Vterm. In this case I1 and I2 are made equal and large so that D1, D2, D5, and D6 are all conducting. R1 and R2 are chosen so:

$$R1 + 2Rd + Ro$$

The inclusion of R2 enables the condition R1 + 2Rd = Ro required for the correct slope resistance of the clamp and the above condition to be meet simultaneously.

Equivalent components may be used instead of those shown in FIGS. 5–7. For example, the resistors may be formed with transistors, and the diodes may be any type of electrical switch.

A clamp having the V/I characteristics described herein can also be used to control reflections on any digital circuit bus line, with the bus line characteristic impedance $Z_O$ matching the resistance $R_{rl}$ of the clamp.

For a driver at either end of a bus or other transmission line, the preferred connection of the clamp is shown in FIG. 3.

For a driver connected somewhere between two ends of the bus or other transmission line, a clamp should be connected to each end of the bus or transmission line.

Thus, V/I characteristics of a line termination circuit have been disclosed which provide superior control of reflections on a line, and several embodiments of a termination circuit approximating these V/I characteristics have also been disclosed. The termination circuits incur none of the drawbacks of prior art termination circuits previously described Numerous modifications and variations will become apparent to those skilled in the art from the above disclosure. It is to be understood that the above detailed description of various embodiments of the invention is intended to be merely illustrative of the spirit and scope of the invention and should not be taken in a limiting sense. The scope of the claimed invention is defined only with reference to the following claims.

I claim:

1. A circuit comprising;
   a transmission line having a first end for being connected to an output of an electrical device which is switchable between a low output state and a high output state, said electrical device having an output impedance approximately equal to or below a characteristic impedance of said transmission line, said electrical device outputting a first voltage level in said low output state and outputting an second voltage level in said high output state when connected to said transmission line;
   a non-linear load circuit having an input terminal connected to a second end of said transmission line, said non-linear load circuit providing a substantially open circuit to said input terminal when a voltage at said input terminal is between said first voltage level and said second voltage level, said non-linear load circuit also providing a substantially constant first load resistance between said input terminal and a reference voltage terminal only when a voltage at said input terminal is below said first voltage level or above said second voltage level, wherein said first load resistance is approximately equal to said characteristic impedance of said transmission line, and wherein when said electrical device connected to said first end of said transmission line switches from said low output state to said high output state, a first positive forward voltage step is propagated on said transmission line toward said second end of said transmission line such that on arriving at said second end of said transmission line with non-linear load circuit provides a first positive reflected voltage on said transmission line of approximately fifty per cent of a difference between said second voltage level and said first voltage level.

2. The circuit of claim 1 wherein said electrical device is a CMOS device.

3. The circuit of claim 1 wherein said non-linear load circuit comprises:
- a first linear load having a first end connected to said input terminal;
- a first diode means having an anode connected to a second end of said first linear load and having a cathode connected to a first voltage source for providing a voltage to said cathode which is approximately one diode drop below said second voltage level; and
- a second diode means having a cathode connected to said second end of said first linear load and having an anode connected to a second voltage source for providing a voltage to said anode which is approximately one diode drop above said first voltage level.

4. The circuit of claim 3 wherein said first linear load comprises a resistor.

5. The circuit of claim 3 wherein said first voltage source comprises:
- a third diode means having a cathode connected to said cathode of said first diode means and having an anode connected to a third voltage source for providing a voltage to said anode equal to said second voltage level;

and wherein said second voltage source comprises:
- a fourth diode means having an anode connected to said anode of said second diode means and having a cathode connected to a fourth voltage source for providing a voltage to said cathode equal to said first voltage level; and
- a second linear load connected between said cathode of said third diode means and said anode of said fourth diode means.

6. The circuit of claim 1 wherein said non-linear load circuit comprises:
- a first diode means having an anode connected to said input terminal and having a cathode connected to a first terminal of a first linear load, a second terminal of said first linear load being connected to a first voltage source for providing a voltage to said second terminal which is approximately one diode drop below said second voltage level; and
- a second diode means having a cathode connected to said input terminal and having an anode connected to a first terminal of a second linear load, a second terminal of said second linear load being connected to a second voltage source for providing a voltage to said second terminal which is approximately one diode drop above said first voltage level.

7. The circuit of claim 6 wherein said first and second linear loads are resistors.

8. The circuit of claim 1 wherein said non-linear load circuit comprises:
- a first linear load having a first end connected to said input terminal;
- a first diode means having an anode connected to a second end of said first linear load and having a cathode connected to a first voltage source for providing a voltage to said cathode which is approximately one diode drop below said second voltage level;
- a second linear load having a first end connected to said input terminal; and
- a second diode means having a cathode connected to a second end of said second linear load and having an anode connected to a second voltage source for providing a voltage to said anode which is approximately one diode drop above said first voltage level.

9. The circuit of claim 8 wherein said first voltage source comprises:
- a third diode means having a cathode connected to said cathode of said first diode means and having an anode connected to a third voltage source for providing a voltage to said anode equal to said second voltage level;

and wherein sad second voltage source comprises:
- a fourth diode means having an anode connected to said anode of said second diode means and having a cathode connected to a fourth voltage source for providing a voltage to said cathode equal to said first voltage level; and
- a third linear load connected between said cathode of said third diode means and said anode of sad fourth diode means.

10. The circuit of claim 3 further comprising:
- a third diode means having a cathode connected to said cathode of said first diode means and having an anode connected to a third voltage source for providing a bias voltage to said anode;
- a fourth diode means having an anode connected to said anode of said second diode means and having a cathode connected to said anode of said third diode means;
- a first current source coupled to said anode of said second diode means; and
- a second current source coupled to said cathode of said first diode means, and said first voltage source comprises:
- a fifth diode means having an anode connected to said cathode of said first diode means, a cathode of said third diode means connected to a fourth voltage source for providing a voltage to said cathode which is approximately two diode drops below said second voltage level;

and wherein said second voltage source comprises:
- a sixth diode means having a cathode connected to said anode of said second diode means, an anode of said sixth diode mean connected to a fifth voltage source for providing a voltage to said anode which is approximately two diode drops above said first voltage level 11. The circuit of claim 10 further comprising a second linear load connected between said third voltage source for providing said bias voltage and said anode of said fifth diode means.

12. The circuit of claim 11 wherein said first current source generates a substantially same current as said second current source.

13. The circuit of claim 1 wherein when said electrical device connected to said first end of said transmission line switches from said high output state to said low output state, a first negative forward voltage step is propagated on said transmission line toward said second end of said transmission line such that on arriving at said second end of said transmission line said non-linear load circuit provides a first negative reflected voltage on said transmission line of approximately fifty per cent of a difference between that said first voltage level and said second voltage level.

* * * * *

UNITED STATES PATENT AND TRADEMARK OFFICE
CERTIFICATE OF CORRECTION

PATENT NO.   :   5,287,022
DATED        :   February 15, 1994
INVENTOR(S)  :   Kenneth R. Wilsher It is certified that error appears in the above-identified patent and that said Letters Patent is hereby corrected as shown below:

In Claim 1, col. 10, line 57, before "a transmission line"
    insert --a tester connected to receive an output of an
    electrical device being tested;--.

In Claim 1, col. 10, line 58, change "an electrical" to
    --said electrical--.

In Claim 1, col. 10, line 68, after "transmission line"
    insert --and to said tester--.

Signed and Sealed this

Second Day of August, 1994

Attest:

BRUCE LEHMAN

Attesting Officer        Commissioner of Patents and Trademarks